United States Patent [19]
Lawson

[11] Patent Number: 6,163,169
[45] Date of Patent: Dec. 19, 2000

[54] CMOS TRI-STATE CONTROL CIRCUIT FOR A BIDIRECTIONAL I/O WITH SLEW RATE CONTROL

[75] Inventor: William Frederick Lawson, Vestal, N.Y.

[73] Assignee: International Business Machines Corporation, Armonk, N.Y.

[21] Appl. No.: 09/132,803

[22] Filed: Aug. 13, 1998

[51] Int. Cl.[7] .................................................. H03K 19/00
[52] U.S. Cl. .................................. 326/58; 326/57; 326/83
[58] Field of Search ................................. 326/56, 57, 58, 326/82, 83, 86, 119, 112, 121

[56] References Cited

U.S. PATENT DOCUMENTS

| | | | |
|---|---|---|---|
| 4,217,502 | 8/1980 | Suzuki et al. | 207/205 |
| 4,638,187 | 1/1987 | Boler et al. | 307/451 |
| 4,724,340 | 2/1988 | Sood | 307/443 |
| 4,731,553 | 3/1988 | Van Lehn et al. | 307/443 |
| 4,800,298 | 1/1989 | Yu et al. | 307/443 |
| 4,859,877 | 8/1989 | Cooperman et al. | 307/443 |
| 5,041,738 | 8/1991 | Walters, Jr. | 307/269 |
| 5,073,726 | 12/1991 | Kato et al. | 307/443 |
| 5,115,150 | 5/1992 | Ludwig | 307/475 |
| 5,311,076 | 5/1994 | Park et al. | 307/443 |
| 5,324,996 | 6/1994 | Mote, Jr. | 307/443 |
| 5,381,059 | 1/1995 | Douglas | 326/58 |
| 5,594,370 | 1/1997 | Nguyen et al. | 326/86 |
| 5,719,506 | 2/1998 | Diba et al. | 326/39 |
| 6,023,174 | 2/2000 | Kirsch | 326/34 |

*Primary Examiner*—Michael Tokar
*Assistant Examiner*—Anh Tran
*Attorney, Agent, or Firm*—John R. Pivnichny

[57] ABSTRACT

A digital circuit pulls up an output node using an NFET device. The digital circuit is part of a CMOS predriver having balanced delays for coming out of tristate mode and for data mode operation. The predriver has size and speed capability advantages and is particularly advantageous when followed by a CMOS driver powered by a lower positive voltage supply.

8 Claims, 3 Drawing Sheets

CMOS TRI-STATE CONTROL CIRCUIT FOR A BIDIRECTIONAL I/O WITH SLEW RATE CONTROL

TECHNICAL FIELD

The invention relates to CMOS circuits and particularly to predriver circuits which preceed off-chip drivers. Even more particularly the invention relates to CMOS predriver circuits which include a capability of placing the following driver into and out of a tristate function in a high speed and controlled manner.

BACKGROUND OF THE INVENTION

Semiconductor chips which contain CMOS logic circuits are well known and widely used throughout the electronic industry because of their inherent high speed performance with relatively low power consumption. A single CMOS logic chip may have over one million individual CMOS devices of both PFET AND NFET type interconnected to form logic circuits e.g. logic gates which are then further interconnected to form various logic functions. The individual CMOS devices are intentionally made as small as possible in order to minimize the total semiconductor chip size and therefore the cost of a chip.

While the CMOS logic circuits are freely interconnected on a chip, when a logic signal must be sent to another chip, then additional driving power is required. Special driver circuits using much larger PFET AND NFET drivers are constructed on the chip in order to handle the increased driving power needed. A driver circuit may need to drive a transmission line with or without terminations. The transmission line may be part of a bus with multiple drivers connected or tapped on at various points, each one increasing the load capacitance which must be driven.

In addition, each driver must normally be capable of entering a tristate mode when not active in order to prevent a conflict with another driver on the bus which is currently active. The driver may also need to provide a termination for the transmission line a described in U.S. Pat. No. 4,859,877 which is incorporated by reference herein.

The driver circuits are of such a high power that they can not be driven directly by ordinary logic gates on the CMOS chip and accordingly a predriver circuit is used between the output of an ordinary logic gate on the chip and the inputs of a driver circuit. As shown in U.S. Pat. No. 5,381,059 there are usually two inputs to a driver circuit, one for the large NFET pull-down device and one for the large PFET pull-up device.

The predriver circuit therefore has two outputs and two or more inputs. The inputs are the data signal, a tristate mode signal and optionally various enable signals or signals to provide a termination function for cases where the driver is located at the end of a transmission line.

Driving the gate of a large PFET pull-up device of the driver circuit to an up level is a problem for a predriver circuit. In order to rapidly pull the gate of the driver PFET device to the upper supply rail, a relatively large PFET device is needed in the predriver circuit. Larger devices tend to be slower so that increasing the predriver PFET size to increase pull-up current does not necessarily result in faster operation.

In cases where supply current transients are more important than operating speed, such as occurs with packages having a relatively large supply inductance, pull up action is intentionally delayed to reduce the effect of noise on other circuits. Boler et al. in U.S. Pat. No. 4,638,187, Yu et al. in U.S. Pat. No. 4,800,298, and Sood in U.S. Pat. No. 4,724,340 all use a PFET driven by an inverted delayed signal, in parallel with an NFET as a pull-up which reduces supply transients. Walters, Jr. in U.S. Pat. No. 5,041,738 uses programmable fuses to control the delay of the rise of a pull-up circuit.

The overall operating speed of a system with the predriver-driver combination is limited by both the slew rate and delay of the driver circuit as well as the time required to enter and return from tristate mode. Usually this mode switching becomes the limiting factor. Therefore it would be advantageous to match the mode switching speed to the operational switching speed so that neither one imposes a significant limitation.

In accordance with the teachings of the present invention, there is defined a new CMOS predriver circuit which includes capability for rapid pull-up of the gate of a driver PFET device and capability for matching mode switching speed to operational speed. It is believed that such a circuit constitutes a significant advancement in the art.

OBJECTS AND SUMMARY OF THE INVENTION

It is therefore a principal object of the present invention to enhance the semiconductor circuit art by providing a digital circuit with enhanced pull up capabilities.

It is a further object to provide a CMOS predriver circuit wherein enhanced predrive capabilities are possible.

It is yet another object of the invention to provide a predriver/driver circuit combination with enhanced capabilities.

These and other objects are attained in accordance with one embodiment of the invention wherein there is provided a digital circuit for pulling up an output node which comprises a PFET having a source, a drain connected to the output node, and a gate, a NFET having a drain connected to the source of the PFET, a source connected to the drain of the PFET and to a pull down circuit, and a gate, and means for simultaneously activating the gate of the PFET and the gate of the NFET to pull up the output node.

In accordance with another embodiment of the invention there is provided a CMOS predriver circuit having first and second outputs which comprises a pair of NFET's with sources connected to ground and drains connected to the first output, first and second PFET's with drains connected to the drains of the pair of NFET's, first and second resistive elements with one end of each resistive element connected to the source of said first and second PFET's respectively, third and fourth PFET's with sources connected to a positive voltage supply and the drains of the third and fourth PFET's connected to a second end of the first and second resistive elements respectively, first and second cascaded inverters having a data input connected to the input of the first inverter, the data input also connected to the gates of the first PFET and one of the pair of NFET's, the output of the second inverter being connected to the gate of the fourth PFET, a third inverter having its input driven by a tristate input, the tristate input also connected to the second and third PFET and the other of the pair of NFET's, third and fourth NFET's having their sources connected to ground with the drain of the fourth NFET connected to the second output and the gate of fourth NFET driven by an enable input, a fifth NFET having its source connected to the drain of the third NFET, its drain connected to the second output, and its gate driven by the data input, fifth and sixth PFET's having their sources connected to the positive voltage supply, their drains connected to the second output, the gate of the fifth PFET being connected to the output of the third inverter, the output also connected to the third NFET, and the gate of the sixth PFET being connected to the data input, and a fifth NFET with source and drain connected to the drain and source respectively of the sixth PFET and its gate connected to the output of the first inverter.

BEST MODE FOR CARRYING OUT THE INVENTION

For a better understanding of the present invention, together with other and further objects, advantages and capabilities thereof, reference is made to the following disclosure and the appended claims in connection with the above-described drawings.

Figure 1:
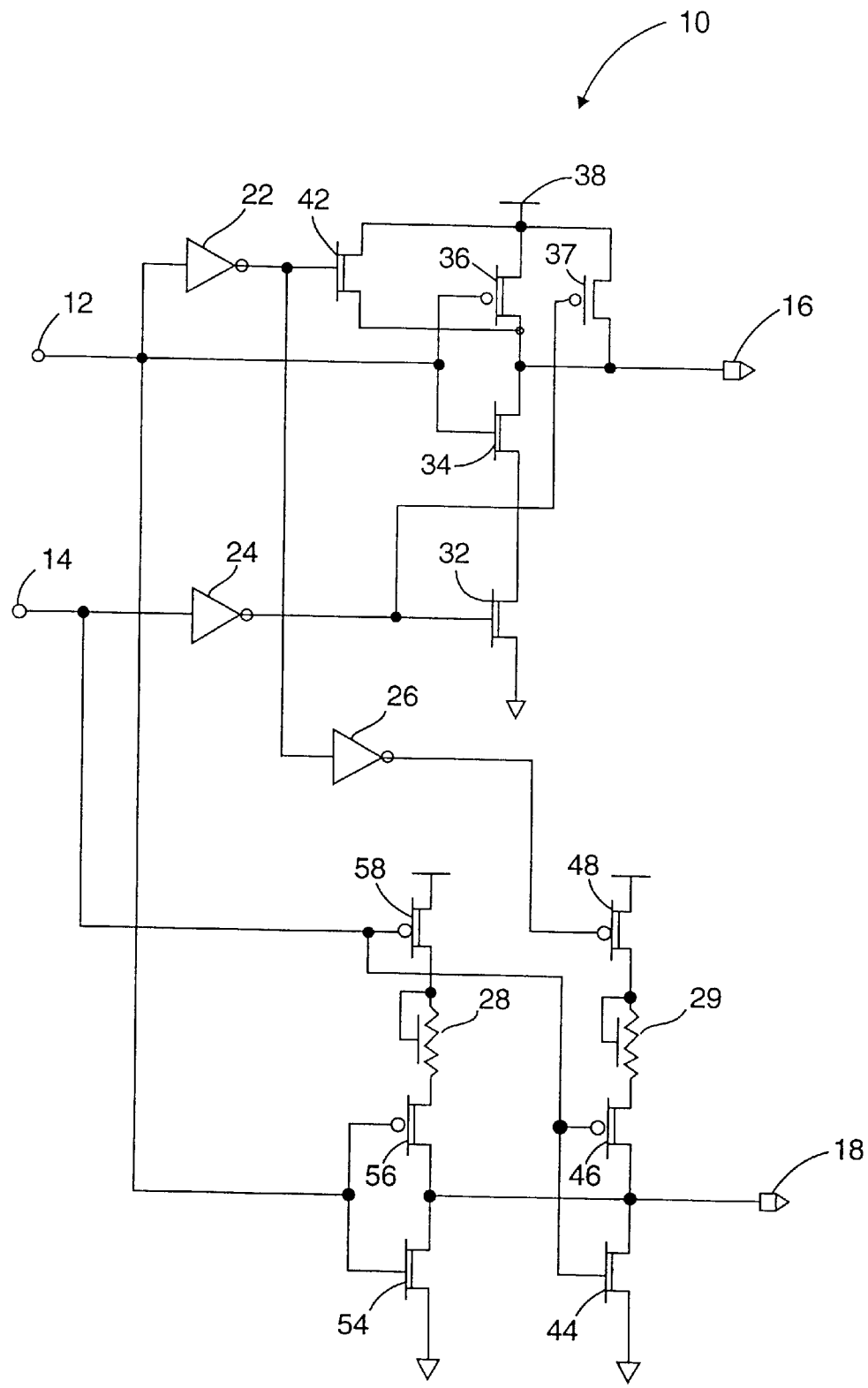
FIG. 1 is a circuit diagram of a predriver illustrating the present invention.

In FIG. 1 there is shown a circuit diagram of a CMOS predriver circuit 10 in accordance with one embodiment of the present invention. The predriver circuit accepts data input 12 and tristate control input 14. PFET Drive output 16 and NFET Drive output 18 are driven by the predriver circuit 10 in accordance with the following description. In normal operation outputs 16 and 18 would be connected to a complimentary pair of high power PFET and NFET devices respectively of a following driver circuit (for example see FIG. 3 described below) as is well known in the art. Other uses of outputs 16 and 18 are possible, however, and the operation of predriver circuit 10 can be understood without further reference to whatever circuit is being driven by these outputs. Output 16 is driven by a complementary CMOS pair, PFET 36 and NFET 34 which are in turn driven simultaneously at their gates directly by data input 12. An additional NFET 32, connected between the source of NFET 34 and ground, is turned on by inverter 24 when tristate input 14 is not active e.g. input 14 is at a down level. However, when tristate operation is desired input 14 is brought to an up level, turning off NFET 32 via inverter 24, interrupting current flow through NFET 34 and activating PFET 37.

As stated in the background, PFET 36 must be relatively large in order to rapidly drive any following driver PFET device gate to an up level. However increasing the size of PFET 36 slows down its own operation, eventually defeating the purpose of any such size increase beyond some limit. In order to further increase the speed of pulling up output 16, NFET 42 is placed in parallel with PFET 36. However NFET 42 is driven by the output of inverter 22, which inverts with minimal delay the data input signal used to operate the gate of PFET 36. NFETs are known in the art to have a higher gain than PFETs so NFET 42 can be made significantly smaller than PFET 36 would be if used by itself and still provide a faster initial pullup of output node 16.

The ability of NFET 42 to pull node 16 up is limited to a maximum positive voltage which is less that positive supply 38. If the gate of NFET 42 is driven to the positive supply by inverter 22, then NFET 42 will stop drawing current as the voltage on it source e.g. the voltage on node 16 approaches one threshold voltage below the gate voltage. PFET 36 however continues to draw current taking node 16 to the positive supply value. For this reason, PFET 36 is retained in the embodiment of FIG. 1.

Figure 3:
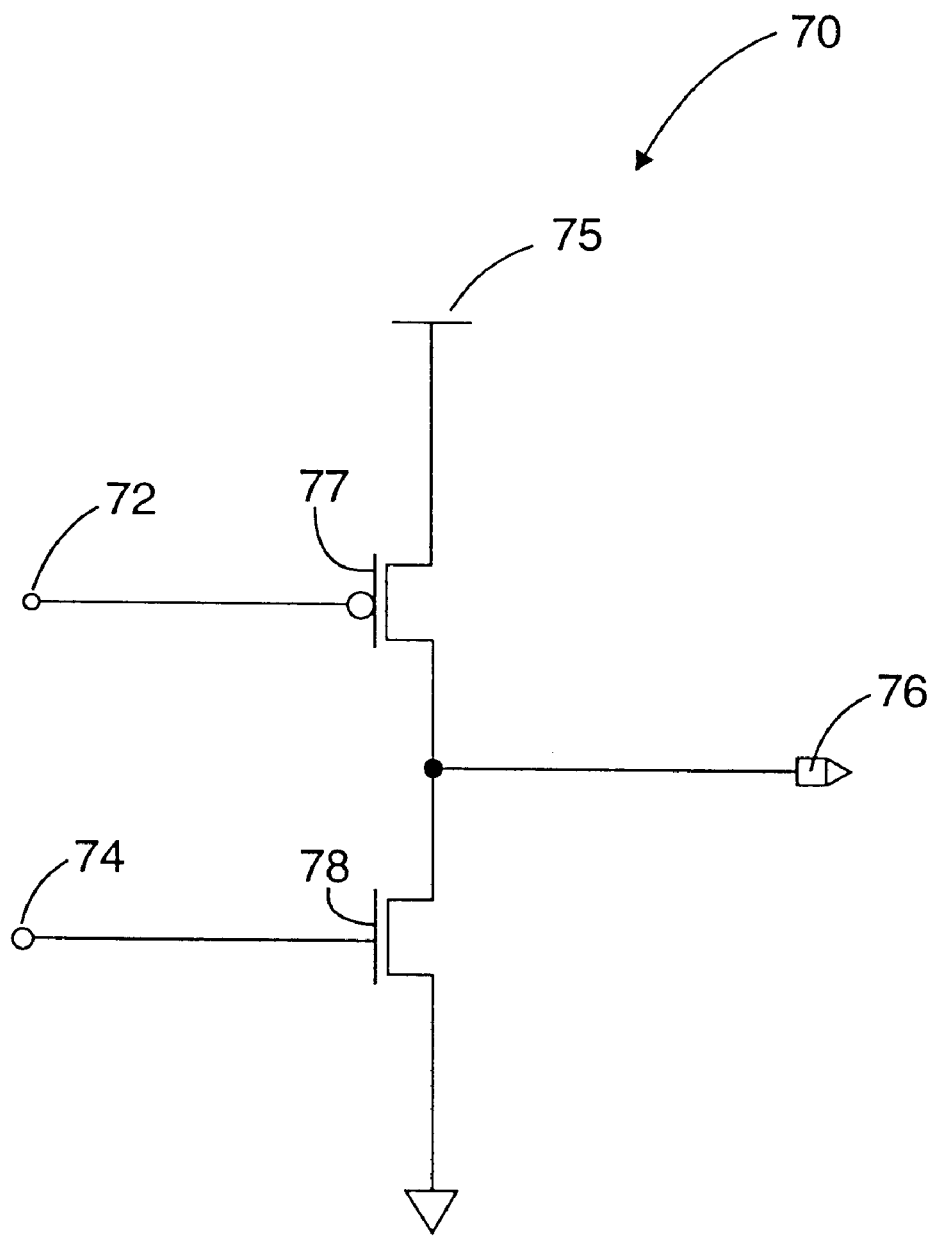
FIG. 3 is a circuit diagram of a CMOS driver which may follow the predriver circuits of FIGS. 1 or 2.

In another embodiment, a driver circuit, such as shown in FIG. 3, following the predriver of the present invention may be operated from a lower positive supply 75 than the predriver positive supply 38. For example, a driver may be designed to operate with a lower voltage bus, or interface to a lower voltage semiconductor part, while internal circuits and predrivers are operated at a higher voltage to optimize on-chip performance. There is no need to pull node 16 to positive supply 38 in this embodiment but just to positive supply 75. This may be within the capability of NFET 42 alone and PFET 36 can be eliminated without departing from the scope of the present invention.

Output node 18 has two driving paths. First, complimentary CMOS pair PFET 56 and NFET 54 are in turn driven at their gates directly by the data input 12. An additional PFET 58 can disable this path when tristate input 14 is activated to an up level. When tristate input 14 is inactive, resistive element 28, connected between the drain of PFET 58 and the source of PFET 56, controls the rate at which output node 18 is pulled up as data input 12 goes to a down level. Secondly, complimentary CMOS pair PFET 46 and NFET 44 are in turn driven by tristate input 14. An additional PFET 48 disables this path whenever data input 12 is in an up level. The gate is PFET 48 is not driven directly by data input 12 but instead is driven by a delayed data signal obtained by inverting the output of inverter 22 with a second inverter 26. When data input 12 is in a down level, resistive element 29, connected between the source of PFET 48 and the drain of PFET 46 controls the rate at which output node 18 is pulled up as tristate input 14 goes to a down level, i.e. the circuit is brought out of tristate mode. The relative and absolute resistive value of resistive elements 28 and 29 are selected to balance the delay of turning on a driver, such as NFET 78 of FIG. 3, during data transitions and when leaving tristate mode. PFET 46 operates more rapidly than PFET 58 at pulling up output 18 when leaving tristate mode because the current supplied by PFET 46 feeds node 18 directly while that from PFET 58 must first pass through resistive element 28 and PFET 56 before passing to node 18. The data input drive to PFET 48 is delayed to reduce its NATO influence while out of tristate mode, so that PFET 56 will operate more rapidly to control pull up of node 18.

Figure 2:
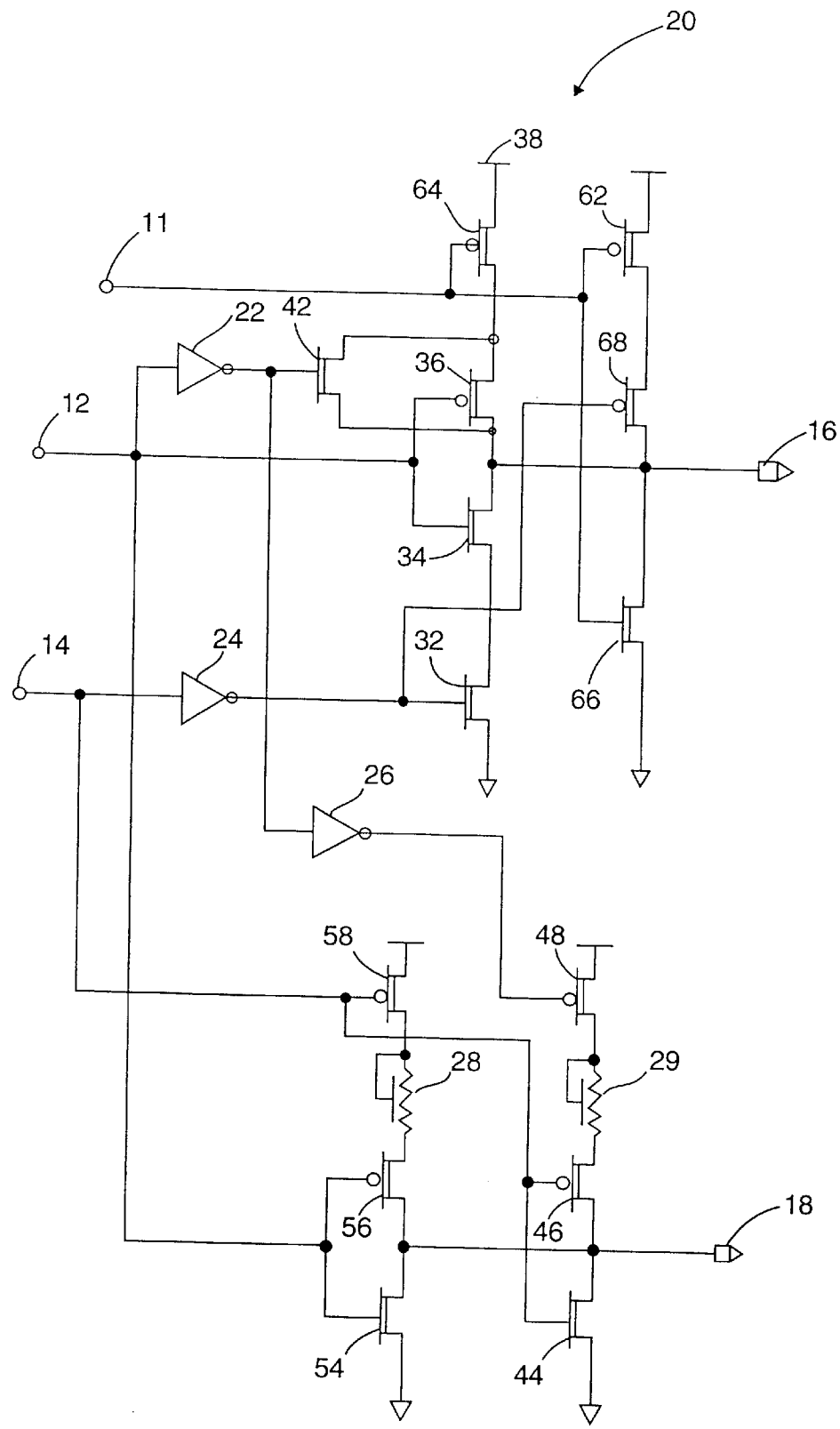
FIG. 2 is a circuit diagram of a predriver in accordance with another embodiment of the present invention.

Another embodiment of the invention, predriver 20, is shown in the circuit diagram of FIG. 2. An additional enable input 11 is added to allow further logical control of the operation of output 16. Enable input 11 is active when in a down level, supplying current via PFET 64 to PFET 36 and NFET 42 which then operate as described above. PFET 62 can at the same time supply current to PFET 68 which during tristate mode pulls node 16 to an up level effectively disabling a driver PFET such as PFET 77 shown in FIG. 3. When enable input 11 is driven to an up level, i.e. disabled, NFET 66 pulls output 16 down as is logically desirable in this embodiment.

FIG. 3 shows a driver circuit 70 which may be used following the predrivers of FIGS. 1 and 2. If used, input 72 is connected to output node 16 and input 74 to output node 18. A high current PFET 77 and complementary high current NFET 78 drive accessible node 76. Driver circuit 70 is preferably located on the same semiconductor chip and in close proximity to predriver circuit 10 or 20. Accessible node 76 is preferably an input/output connection to the chip such as may be provided in the form of a wire bonding pad or C4 connection pad. A transmission line matching resistor (not shown) may be placed in series with accessable node 76, either on or off chip, in order to provide a proper impedance termination for an external net.

As described the driver circuit expands the capabilities of the invention. The invention is thus deemed to constitute a significant advancement in the art.

While there has been shown and described what are at present considered the preferred embodiments of the invention, it will be obvious to those skilled in the art that various changes and modifications may be made therein without departing from the scope of the invention as defined by the appended claims.

What is claimed is:

1. A CMOS predriver circuit having first and second outputs, comprising:

a pair of NFET's with sources connected to ground and drains connected to said first output;

first and second PFET's with drains connected to said drains of said pair of NFET's;

first and second resistive elements with one end of each resistive element connected to the source of said first and second PFET's respectively;

third and fourth PFET's with sources connected to a positive voltage supply and the drains of said third and fourth PFET's connected to a second end of said first and second resistive elements respectively;

first and second cascaded inverters having a data input connected to the input of said first inverter, said data input also connected to the gates of said first PFET and one of said pair of NFET's, the output of said second inverter being connected to the gate of said fourth PFET;

a third inverter having its input driven by a tri-state input, said tri-state input also connected to said second and third PFET and the other of said pair of NFET's;

third and fourth NFET's having their sources connected to ground with the drain of said fourth NFET connected to said second output and the gate of said fourth NFET driven by an enable input;

a fifth NFET having its source connected to the drain of said third NFET, its drain connected to said second output, and its gate driven by said data input;

fifth and sixth PFET's having their sources connected to said positive voltage supply, their drains connected to said second output, the gate of said fifth PFET being connected to the output of said third inverter, said output also connected to said third NFET, and the gate of said sixth PFET being connected to said data input; and a sixth NFET with source and drain connected to the drain and source respectively of said sixth PFET and its gate connected to the output of said first inverter.

2. The CMOS predriver circuit of claim 1 wherein said sources of said fifth and sixth PFET's are each connected to said positive voltage supply through a respective switched PFET, each said respective PFET activated by an enable input.

3. A circuit in accordance with claim 1 further comprising a PFET device having a drain, a source, and a gate, said source connected to a second positive voltage supply, said drain connected to an accessible node, said gate connected to said second output, and a NFET device having a drain connected to said accessible node, a source connected to said ground node, and a gate connected to said first output.

4. The circuit of claim 3 wherein all said PFET's, said NFET's, said resistive elements, and said connections are positioned on a single semiconductor chip.

5. The circuit of claim 4 wherein said accessible node is an input/output pad of said semiconductor chip.

6. The circuit of claim 3 wherein said second positive voltage is about the same voltage as said second positive voltage.

7. The circuit of claim 3 wherein said second positive voltage is substantially less than said first positive voltage.

8. A plurality of circuits in accordance with claim 3 located on two or more separate semiconductor chips wherein said accessible node of each said circuit is connected to said accessible node of all remaining circuits of said plurality of circuits.

* * * * *